United States Patent [19]

Lepek et al.

[11] Patent Number: 4,953,148

[45] Date of Patent: Aug. 28, 1990

[54] ELIMINATION OF MAGNETIC INFLUENCE ON ATOMIC CLOCKS

[76] Inventors: Alexander Lepek, 11 B, Moshe Sharet Boulevard, Jerusalem, Israel; Avinoam Stern, 3 Haetzel Street, Jerusalem, Israel

[21] Appl. No.: 347,869

[22] Filed: May 5, 1989

[30] Foreign Application Priority Data

May 6, 1988 [IL] Israel ........................................ 86301

[51] Int. Cl.[5] .......................... G04B 17/20; H03L 7/26

[52] U.S. Cl. ..................................... 368/202; 368/200; 331/3

[58] Field of Search ............... 368/200, 202, 203, 204; 331/3, 94.3

[56] References Cited

U.S. PATENT DOCUMENTS 4,446,446 5/1984 Fowks ............................... 331/36 C 4,476,445 10/1984 Riley, Jr. ............................... 331/44

*Primary Examiner*—Bernard Roskoski

*Attorney, Agent, or Firm*—Fleit, Jacobson, Cohn, Price, Holman & Stern

[57] ABSTRACT

Improved atomic clocks and frequency standards of the type where the frequency of an oscillator is stabilized by locking via a phase lock loop to an atomic resonator and where the output of the clock is taken from this oscillator. Protective means are provided to maintain a high accuracy when such clock is exposed to a strong magnetic field. The stabilization is based on two magnetic "C"-fields which are controlled and adjusted to maintain the accuracy of the clock.

8 Claims, 3 Drawing Sheets

ELIMINATION OF MAGNETIC INFLUENCE ON ATOMIC CLOCKS

BACKGROUND OF THE INVENTION

The invention relates to means for essentially cancelling out the adverse effects of magnetic fields on the accuracy of atomic clocks and frequency standards. The invention further relates to a method of operating such clocks in such a manner as to retain a high degree of accuracy even when such clocks are exposed to spurious magnetic fields.

SUMMARY OF THE INVENTION

According to the invention two magnetic "C"-fields are established, fields HC1 and HC2, respectively, where field HC1 is used to control the frequency of the oscillator of the clock. The changes of the field HC2 are measured, the resulting values being indicative of the magnetic disturbance at any specific instant of time. The fields HC1 and HC2 are varied in such a manner that the frequency of the clock is maintained. According to a preferred embodiment of the invention, the difference between HC1 and HC2 is maintained essentially constant, thus keeping the difference between the resulting frequencies of the fields HC1 and HC2 F4 and F5, respectively, constant, and controlling the oscillator of the clock by means of frequency F4.

The invention is applicable and intended for use in atomic clocks and atomic frequency standards, referred to hereinafter as "atomic clocks", wherein the frequency of an oscillator is stabilized by locking it via a phase lock loop or other means to an atomic resonator and where the output of the clock is taken from the oscillator.

The present invention will become more readily apparent when reference is made to the following description taken in conjunction with the accompanying drawings.

DETAILED DESCRIPTION OF THE DRAWINGS

Figure 1:
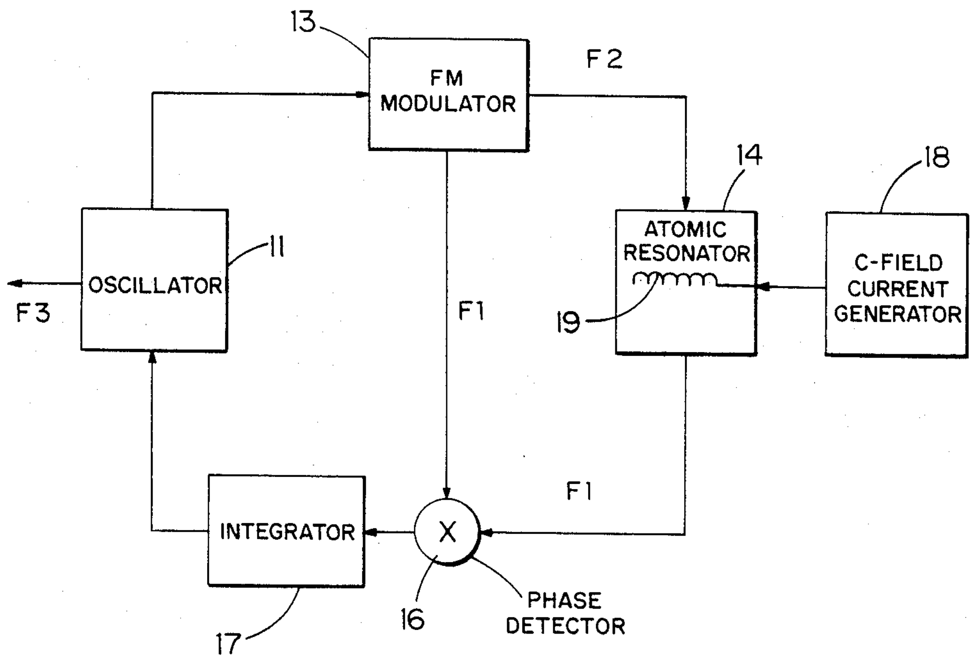
FIG. 1 is a block diagram of a conventional atomic clock.

As shown in FIG. 1, a conventional atomic clock comprises in combination an oscillator 11 which generates a frequency F2 which is modulated at frequency F1 by the FM modulator 13, the Atomic resonance frequency being within the modulation range of the FM modulator. The atomic resonator 14 provides an output signal whenever the modulated frequency F2 exceeds the resonance frequency thus generating an output at frequency F1, the same as the modulation frequency. The phase of this output depends on the deviation of the oscillator 11 from the required frequency. There is provided a phase comparator 16 for measuring the phase difference, which is filtered in the integrator 17, the output of which is used to correct the frequency of the oscillator 11. The output frequency F3 of the clock is a function proportional to frequency F2 and is thus stabilized. The resonance frequency depends on the approximation of a magnetic field according to to the expression:

$$F=F_o+a.H^2=f_o+(Hc+Hr)^2,$$

where F is the resonance frequency in the presence of a magnetic field, and where $F_o$ is the resonance frequency with no magnetic field, where "a" is a constant typical of such type of clock, where H is the magnetic field resulting from the "C" field Hc generated by a current from the C-field current generator 18 through the "C" field coil 19 and a magnetic field Hr which results from the magnetic disturbance.

Figure 2:
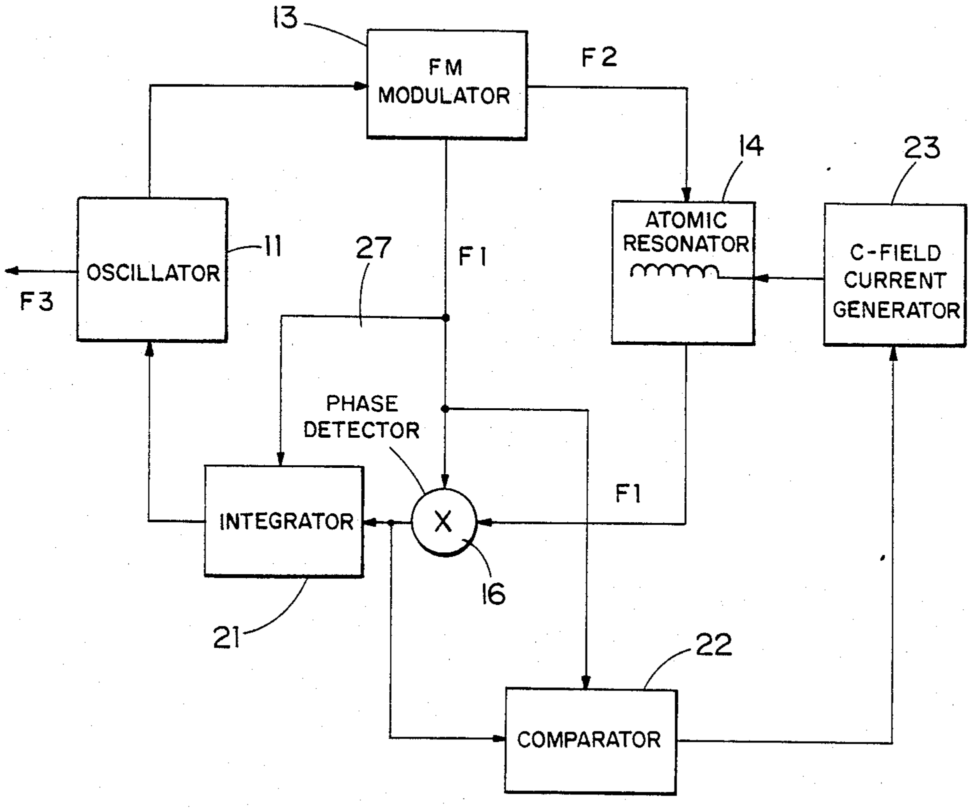
FIG. 2 is a block diagram of an improved clock according to the present invention.

FIG. 2 illustrates an atomic clock according to the present invention, which essentially comprises the elements set out in FIG. 1, and which contains additional elements for the correction of magnetic disturbances.

According to the invention, and as illustrated by way of example only with reference to FIG. 2, the atomic clock is operated in such a manner that $F=F_o+(Hc+Hr)^2$ is kept constant under changes of the magnetic field Hr by changing the magnetic field Hc so as to compensate for the frequency changes of the atomic clock and keep the output frequency essentially constant. This is accomplished by generating two levels of current in the current generator 23 of Hc, thus producing magnetic fields Hc1+Hr and Hc2+Hr in an alternating manner, for generating two alternating resonance frequencies F4 and F5, respectively, and producing in the phase detector 16 two phases, the phase due to Hc1+Hr being used to lock the oscillator 11 so that the controlling resonance frequency will depend always only on the field Hc1+Hr. From this, it follows that $$F4=F_o+(Hc1+Hr)^2$$

$$F5=F_o+(Hc2+Hr)^2$$

Electronic control provided to keep DF F4-F5=constant, so that the current generator 23 will keep the relation DH=Hc2−Hc1 constant. From this it follows that:

$$DF=(Hc_1^2-Hc_2^2)+2Hr(Hc_1-Hc_2)=\text{constant}$$

since Hc1≠Hc2 and $Hc_1-Hc_2$ is kept constant it follows that $Hc_1+Hc_2+2\ Hr=\text{constant}$ $Hc_1+Hr=\text{constant}$, and therefore F4 is constant (and F5 is constant).

Therefore, by keeping constant the difference between Hc1 and Hc2 so that DF will be constant, the resonance frequency will be kept at a constant value as required. A special case is when Hc1=−Hc2 and DF=$\phi$. This "C" field reversal is possible in clock types which are insensitive to field reversal (such as optically pumped Rubidium Gas Cell, optically pumped Cesium beam resonator and Hydrogen Maser).

Two variations to the above described scheme are as follows:

A. In the first variation, the oscillator 11 is locked to a function of F4 and F5, g(F4,F5). Hc1 and Hc2 are varied in such a way that g(F4,F5) remains constant under variation of Hr.

B. In the second variation, instead of the "C" field having two discrete values, it can vary as a periodic function, designated P1(t). For example, P1(t)=sin wt. In this case the output of the phase detector 16, is also a periodic function, designated P2(t). Then the oscillator 11 is locked to a function of P2(t). For example, h(P2)=root-mean-square value of P2(t).

As shown in FIG. 2, the C-field current generator 23 alternates the C-field between Hc1 and Hc2=Hc1+constant. Thus, the output of the phase detector 16 alternates between V1 and V2 respectively. The comparator 22 measures the difference between V1 and V2 and offsets the outputs of the "C" field current generator, HC1 and HC2, so that V1-V2 is kept constant. Because V1 and V2 occur at different instances of time, synchronization is provided by the signal F1 to synchronize the sampling of these parameters for analysis by the comparator 22.

Figure 3:
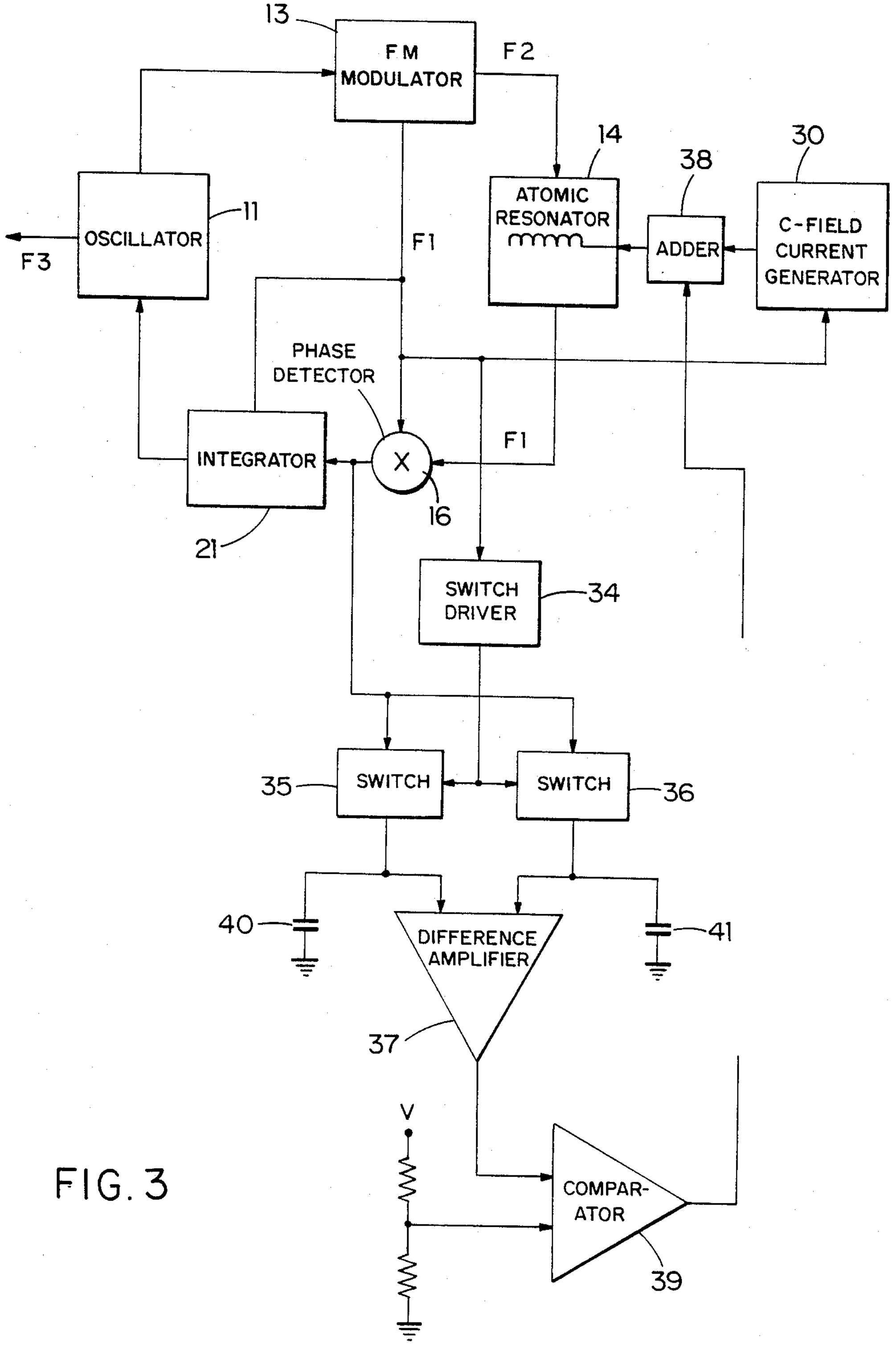
FIG. 3 is a detailed block diagram of a specific embodiment of the present invention.

FIG. 3 shows a working example according to the invention realized in a Rubidium Gas Cell atomic clock. In this Example $F_1$ is 440 Hz. $F_2$ is a carrier of frequency of about 9.2 GHz modulated at 440 Hz and F=10 MHz. The atomic resonator 14 produces two resonance frequencies $F_4$ and $F_5$ as will be described; $F_1$ is used to synchronize a switch driver 34.

The switch driver 34 has an output signal at 2 alternate voltage levels changing at frequency of 440 Hz. One level is used to drive switch 35 and the other to drive switch 36 in such a way that when one switch is open the other is closed and vice-versa. These switches comprise together with condensers 40 and 41 two sample and hold devices. The input to the switches 35 and 36 comes from the output of the phase detector 16, so that the output of a difference amplifier 37 amplifying the voltage difference of the two sample and hold devices is a monotonic function of the phase difference detected in the phase detector 16, generated by the two resonance frequencies $F_4$ and $F_5$.

The "C" field generator 30 generates two alternate levels of current changing with frequency 440 Hz. These changes are synchronized by $F_1$ and are in phase with the driver 34, so that the voltage output at the differential amplifier 37 reflects the phase changes due to the two resonance frequencies generated in the resonator 14 by the "C" field generator 30.

The output of the differential amplifier 37 is compared in comparator 39 to zero voltage. The difference voltage at the output of 39 is used to shift the average level of the C-field current generator 30 using the adder 38, in such a way that the frequencies $F_4$ and $F_5$ are kept constant and the output of 37 is zero.

The two levels of 30 are set so that no external magnetic field is generated, and when the comparator 39 is disconnected from the adder 38, the output of the differential amplifier 37 is zero.

I claim:

1. An atomic clock system for maintaining a high degree of accuracy when exposed to magnetic disturbances, said system comprising:
   - oscillator means for generating first and second oscillator signals, said first signal being a desired clock signal;
   - frequency modulation means for modulating said second oscillator signal and providing a modulator output signal, and for providing a synchronizing signal;
   - C-field current generating means for alternatingly generating first and second current signals;
   - atomic resonator means receiving said first and second current signal for generating first and second magnetic fields, respectively, and first and second resonator frequency signals corresponding to said first and second magnetic fields, respectively;
   - phase detection means receiving said first and second resonator frequency signals and said synchronizing signal for producing first and second phase detection output signals corresponding to said first and second resonator frequency signals;
   - integrator means receiving said synchronizing signal for filtering said first phase detection output signal upon receiving said first phase detection signal under control of said synchronizing signal and producing a correction output signal fed to said oscillator means; and
   - comparator means receiving said synchronizing signal and said first and second phase detection output signals for computing the difference between said first and second phase detection output signals and producing a comparator output signal feeding said C-field current generator for controlling said C-field current generator to maintain said first oscillator signal at a stable frequency.

2. The atomic clock system of claim 1, wherein said comparator means produces said comparator output signal so that the difference between said first and second magnetic fields is maintained constant, the second magnetic field being generated by said C-field current generator in such a way that the difference between said first and second resonator frequency signals is constant.

3. The atomic clock system of claim 1, wherein the comparator means controls said atomic resonator means such that said first and second magnetic fields are opposite in sign and so that the difference between the frequencies of said first and second resonator frequency signals is zero.

4. A method for maintaining high accuracy of an atomic clock, comprising the steps of:
   - generating first and second oscillator signals, said first oscillator signal being a desired clock signal;
   - frequency modulating said second oscillator signal and providing a modulated output signal;
   - alternatingly generating first and second magnetic fields;
   - providing a synchronizing signal for identifying the presence of said first and second magnetic fields at any instant of time;
   - generating first and second resonator frequency signals corresponding to said first and second magnetic fields;
   - detecting the phase of said first and second resonator frequency signals under control of said synchronizing signal and producing first and second phase detection output signals;
   - detecting the presence of said first phase detection output signal under control of said synchronizing signal for filtering said first phase detection output signal and producing a correction output signal only upon the presence of said first phase detection signal;
   - adjusting the frequency of said first oscillator signal according to said correction output signal;
   - computing the difference between said first and second phase detection output signals and producing a control signal; and
   - adjusting said first and second magnetic fields according to said control signal.

5. The method according to claim 4, and further comprising the step of maintaining the difference between said first and second magnetic fields constant.

6. The method of claim 4, and further comprising the step of maintaining said first and second magnetic fields at opposite polarities.

7. An atomic clock system for maintaining a high degree of accuracy when exposed to magnetic disturbances, said system comprising:

oscillator means for generating first and second oscillator signals, said first signal being a desired clock signal;

frequency modulation means for modulating said second oscillator signal and providing a modulator output signal, and for providing a synchronizing signal;

C-field current generating means for alternatingly generating first and second current signals;

atomic resonator means receiving said first and second current signals for generating first and second magnetic fields, respectively, and first and second resonator frequency signals corresponding to said first and second magnetic fields, respectively;

phase detection means receiving said first and second resonator frequency signals and said synchronizing signals for producing first and second phase detection output signals corresponding to said first and second resonator frequency signals;

integrator means receiving said synchronizing signal for filtering said first phase detection output signal upon receiving said first phase detection signal under control of said synchronizing signal and producing a correction output signal fed to said oscillator means;

first and second sample and hold means receiving said first and second phase detection output signals, respectively, for generating first and second sample and hold outputs;

switch driver means receiving said synchronizing signal for driving said first and second sample and hold means under control of said synchronizing signal for triggering the sample and hold of said first and second phase detection output signals upon the respective presence thereof;

differencing means receiving said first and second sample and hold outputs for computing the difference between said first and second phase detection output signals and generating a difference output signal;

comparator means receiving said differencing output signal for comparing said differencing output signal with a preset value and generating an output control signal; and adding means connected between said C-field current generating means and said atomic resonator means for receiving said output control signal and said first and second current signals for adjusting said first and second current signals to keep the difference between the frequencies of said first and second resonator frequency signals constant.

8. The atomic clock system of claim 7, wherein said first and second sample and hold means comprises first and second switching means connected to first and second capacitors, respectively.

* * * * *